(12) United States Patent
Katayama et al.

(10) Patent No.: US 9,887,117 B2
(45) Date of Patent: Feb. 6, 2018

(54) ELECTROSTATIC CHUCK AND SEMICONDUCTOR-LIQUID CRYSTAL MANUFACTURING APPARATUS

(71) Applicant: SHINKO ELECTRIC INDUSTRIES CO., LTD., Nagano-shi (JP)

(72) Inventors: Yoshifumi Katayama, Nagano (JP); Jiro Kawai, Nagano (JP)

(73) Assignee: SHINKO ELECTRIC INDUSTRIES CO., LTD., Nagano-shi (JP)

(*) Notice: Subject to any disclaimer, the term of this patent is extended or adjusted under 35 U.S.C. 154(b) by 287 days.

(21) Appl. No.: 14/707,322

(22) Filed: May 8, 2015

(65) Prior Publication Data

US 2015/0340261 A1 Nov. 26, 2015

(30) Foreign Application Priority Data

May 22, 2014 (JP) .................................. 2014-105877

(51) Int. Cl.
  *H01L 21/683* (2006.01)
  *H02N 13/00* (2006.01)
  *G02F 1/13* (2006.01)

(52) U.S. Cl.
  CPC ........ *H01L 21/6833* (2013.01); *G02F 1/1303* (2013.01)

(58) Field of Classification Search
  CPC ............. H01L 21/6833; H01L 21/6831; H01L 21/683; H01L 21/265; G02F 1/1303; H02N 13/00; H05F 3/02

(Continued)

(56) References Cited

U.S. PATENT DOCUMENTS 5,339,058 A 8/1994 Lique
5,543,000 A 8/1996 Lique
(Continued)

FOREIGN PATENT DOCUMENTS

JP H08-502634 A 3/1996
JP 2002-517093 A1 6/2002
(Continued)

OTHER PUBLICATIONS

Japanese Office Action for counterpart Japanese Patent Application No. 2014-105877 dated Sep. 26, 2017 (2 Sheets, 2 Sheets translation, 4 Sheets total).

*Primary Examiner* — Thienvu Tran
*Assistant Examiner* — Nicolas Bellido
(74) *Attorney, Agent, or Firm* — Kratz, Quintos & Hanson LLP

(57) ABSTRACT

An electrostatic chuck includes a base plate including a penetration hole, a placing table arranged on the base plate, and including an electrode at a position corresponding to the penetration hole, a first cylindrical insulating component arranged on an upper side inside the penetration hole of the base plate, a second cylindrical insulating component arranged on the first cylindrical insulating component, a third cylindrical insulating component arranged under the first cylindrical insulating component, and having an inner diameter smaller than an inner diameter of the first cylindrical insulating component, a connector arranged in the penetration hole, a cylindrical member included in the connector, and including an elastic body in an inner part, and a power feeding terminal included in the connector, and connected to the elastic body. The power feeding terminal touches the electrode of the placing table.

6 Claims, 7 Drawing Sheets

(58) Field of Classification Search
USPC .......................................... 361/234; 279/128
See application file for complete search history.

(56) References Cited

U.S. PATENT DOCUMENTS

| | | | | |
|---|---|---|---|---|
| 5,625,526 | A | * 4/1997 | Watanabe | ............... G03F 7/707 |
| | | | | 361/234 |
| 6,072,685 | A | 6/2000 | Herchen | |
| 6,151,203 | A | * 11/2000 | Shamouilian | ....... H01L 21/6833 |
| | | | | 361/234 |
| 2011/0240221 | A1* | 10/2011 | Yamamoto | ........ H01J 37/32091 |
| | | | | 156/345.28 |
| 2013/0220545 | A1* | 8/2013 | Koizumi | ........... H01L 21/67103 |
| | | | | 156/345.27 |
| 2013/0286531 | A1* | 10/2013 | Shiraiwa | ............. H01L 21/6833 |
| | | | | 361/234 |
| 2014/0069585 | A1* | 3/2014 | Aoto | ................... H01L 21/6831 |
| | | | | 156/345.52 |

FOREIGN PATENT DOCUMENTS

| | | | |
|---|---|---|---|
| JP | 2008047657 A | * | 8/2006 |
| JP | 2013-229464 A1 | | 11/2013 |

* cited by examiner

US 9,887,117 B2

ELECTROSTATIC CHUCK AND SEMICONDUCTOR-LIQUID CRYSTAL MANUFACTURING APPARATUS

CROSS-REFERENCE TO RELATED APPLICATIONS

This application is based upon and claims the benefit of priority of the prior Japanese Patent Application No. 2014-105877, filed on May 22, 2014, the entire contents of which are incorporated herein by reference.

FIELD

This invention is related to an electrostatic chuck to be used as a mechanism for attracting a wafer or the like, and to a semiconductor-liquid crystal manufacturing apparatus including the same.

BACKGROUND ART

In the prior art, a semiconductor manufacturing apparatus such as dry etching apparatus used for a semiconductor wafer processing or the like is provided with an electrostatic chuck for placing and electrostatically attracting a wafer in order to control temperature of the wafer during the wafer processing.

Among such electrostatic chucks, there is a ceramic chuck of a high-temperature type which is used in a state that it is heated by a heater.

A related art is disclosed in Japanese National Publication of International Patent Application No. 2002-517093, and Japanese Laid-open Patent Publication No. 2013-229464.

As will be explained in the preliminary matter section below, when the electrostatic chuck is heated, a placing table warps in a convex shape. Therefore, a space is formed between a power feeding terminal and a connection electrode of the placing table, thus sometimes it is impossible to apply voltage.

SUMMARY

According to one aspect discussed herein, there is provided an electrostatic chuck, including a base plate including a penetration hole, a placing table arranged on the base plate, the placing table including an electrode at a position corresponding to the penetration hole, a first cylindrical insulating component arranged on an upper side inside the penetration hole of the base plate, a second cylindrical insulating component arranged on the first cylindrical insulating component, a third cylindrical insulating component arranged under the first cylindrical insulating component, the third cylindrical insulating component having an inner diameter smaller than an inner diameter of the first cylindrical insulating component, a connector arranged in the penetration hole, a cylindrical member included in the connector, the cylindrical member including an elastic body in an inner part, and a power feeding terminal included in the connector, the power feeding terminal connected to the elastic body, wherein the power feeding terminal touches the electrode of the placing table in a state that the cylindrical member of the connector is fixed by the third cylindrical insulating component.

Also, according to another aspect discussed herein, there is provided a semiconductor-liquid crystal manufacturing apparatus, including a chamber, and an electrostatic chuck attached in the chamber, wherein the electrostatic chuck includes a base plate including a penetration hole, a placing table arranged on the base plate, the placing table including an electrode at a position corresponding to the penetration hole, a first cylindrical insulating component arranged on an upper side in an inside of the penetration hole of the base plate, a second cylindrical insulating component arranged on the first cylindrical insulating component, a third cylindrical insulating component arranged under the first cylindrical insulating component, the third cylindrical insulating component having an inner diameter smaller than an inner diameter of the first cylindrical insulating component, a connector arranged in the penetration hole, a cylindrical member included in the connector, the cylindrical member including an elastic body in an inner part, and a power feeding terminal included in the connector, the power feeding terminal connected to the elastic body, and the power feeding terminal touches the electrode of the placing table in a state that the cylindrical member of the connector is fixed by the third cylindrical insulating component.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENT

Hereinbelow, an embodiment of the present invention will be explained with reference to the accompanying drawings.

Prior to the explanation of an embodiment, the preliminary matter to be set forth as a basis will be explained hereunder. An electrostatic chuck according to the preliminary matter is the basis of an electrostatic chuck of the present invention, and is not a known art.

Figure 1:
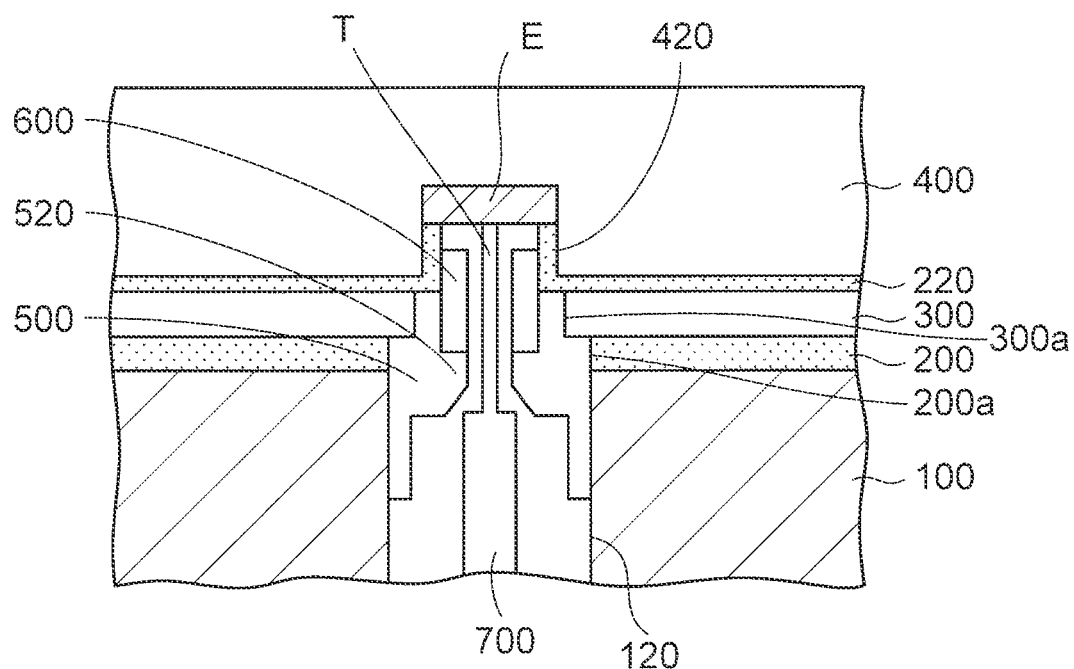
FIG. 1 is a partial cross-sectional view depicting a state of a power feeding portion of an electrostatic chuck according to a preliminary matter.

In electrostatic chucks, there is a high-temperature type which is used in a state that it is heated by a heater. FIG. 1 partially depicts a state of a power feeding portion of the electrostatic chuck of the high-temperature type.

As depicted in FIG. 1, the electrostatic chuck includes a base plate 100, and a penetration hole 120 is formed in the base plate 100. A heater 300 is bonded on the base plate 100 by a first adhesive layer 200.

In the first adhesive layer 200, an opening portion 200a is provided at a position corresponding to the penetration hole 120 of the base plate 100. Moreover, in the heater 300, an opening portion 300a is provided on the opening portion 200a of the first adhesive layer 200.

Further, a placing table 400 is bonded on the heater 300 by a second adhesive layer 220.

In the placing table 400, a concave portion 420 is formed at a position corresponding to the opening portion 300a of the heater 300. The placing table 400 includes a connection electrode E on a bottom surface of the concave portion 420, and the connection electrode E is connected to an electrostatic electrode (not depicted) formed in an inner part of the placing table 400.

Moreover, a first cylindrical insulating component 500 is arranged from an inner wall of the opening portion 300a of the heater 300 to an inner wall of the penetration hole 120 of the base plate 100. The first cylindrical insulating component 500 includes a protruding portion 520 having an annular shape and protruding inward.

Moreover, a second cylindrical insulating component 600 is arranged on the protruding portion 520 of the first cylindrical insulating component 500. The inner diameter of the second cylindrical insulating component 600 is set to be substantially equal to the inner diameter of the protruding portion 520 of the first cylindrical insulating component 500.

Further, a connector 700 including a power feeding terminal T is inserted from the penetration hole 120 of the base plate 100 to the concave portion 420 of the placing table 400, thus the power feeding terminal T touches the connection electrode E of the placing table 400. The power feeding terminal T is coupled to a spring (not depicted) inside the connector 700 and presses the connection electrode E by the elastic force of the spring.

In this way, the power feeding terminal T of the connector 700 touches the connection electrode E of the placing table 400, thereby the voltage is applied from the power feeding terminal T to the electrostatic electrode (not depicted) connected to the connection electrode E.

In FIG. 1, the power feeding terminal T of the connector 700 is arranged in the center of the second cylindrical insulating component 600 without contacting an inner wall of the second cylindrical insulating component 600.

Figure 2:
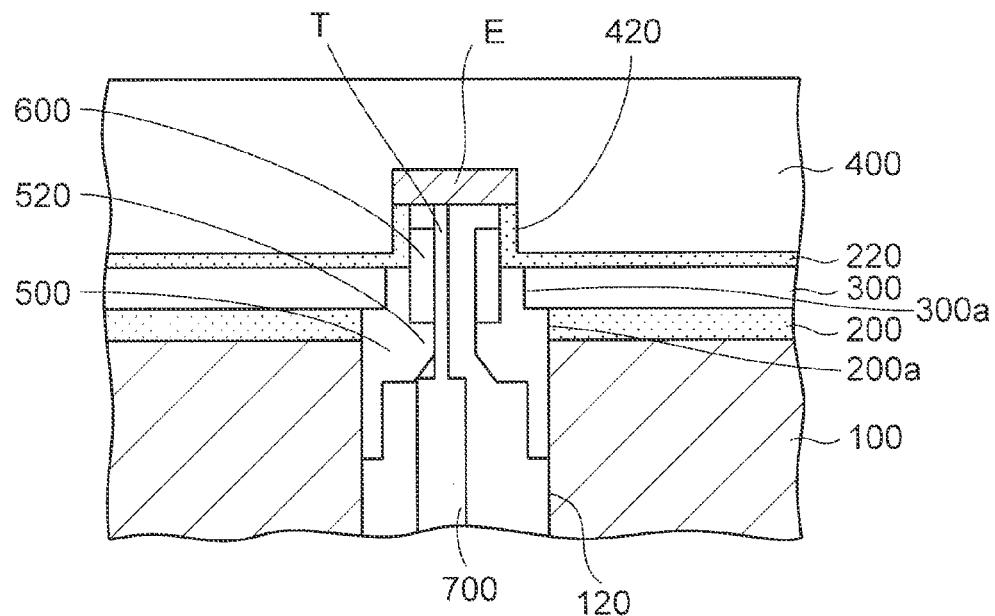
FIG. 2 is a partial cross-sectional view for explaining a problem in the electrostatic chuck in FIG. 1 (part 1).

However, as depicted in FIG. 2, in some cases, the power feeding terminal T of the connector 700 sometimes touches the connection electrode E of the placing table 400 in a state that the power feeding terminal T contacts the inner wall of the second cylindrical insulating component 600.

A lower end side of the connector 700 is fixed to be screwed to the penetration hole 120 of the base plate 100, but the power feeding terminal T is inserted with a free state in an inner part of the second cylindrical insulating component 600. For this reason, the power feeding terminal T sometimes contacts the inner wall of the second cylindrical insulating component 600 by the manufacturing tolerance of each member.

Figure 3:
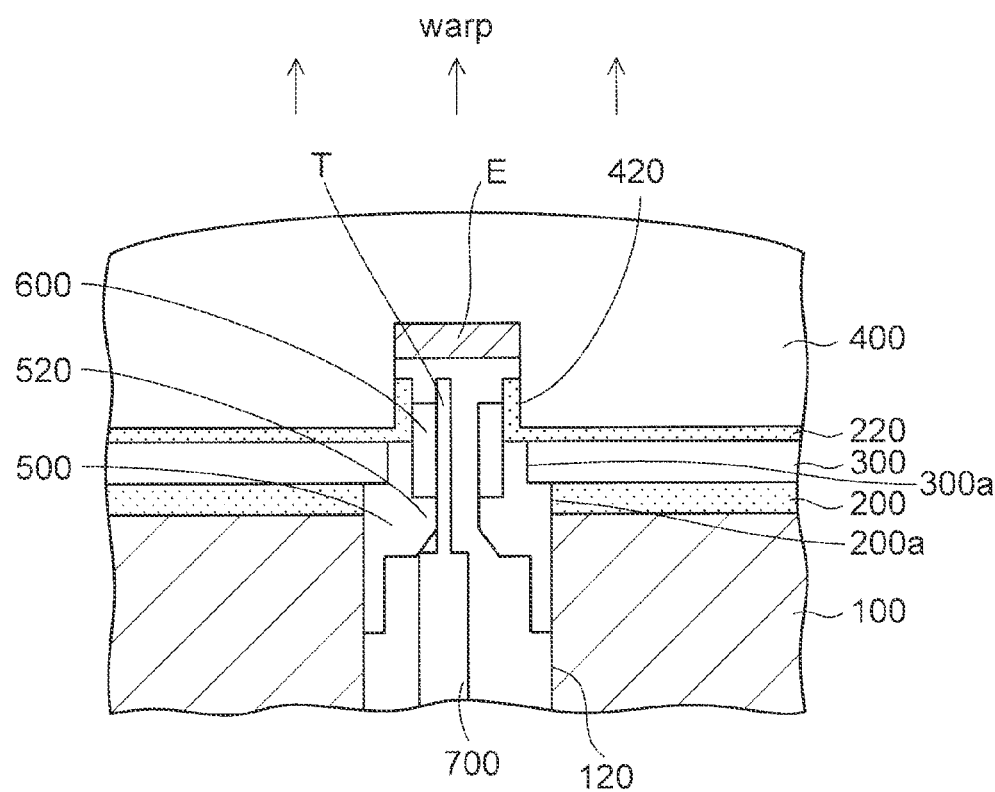
FIG. 3 is a partial cross-sectional view for explaining the problem in the electrostatic chuck in FIG. 1 (part 2).

FIG. 3 depicts a state that the heater 300 in the electrostatic chuck in the state of FIG. 2 is turned on to heat the placing table 400 at a temperature of about 120° C. At this time, the placing table 400 which is made of ceramic warps into a convex shape by the heating, therefore, the connection electrode E of the placing table 400 moves upward as well.

Also, at this time, under normal circumstances, since the power feeding terminal T of the connector 700 is coupled to the spring, the power feeding terminal T follows the movement of the connection electrode E by the elastic force, and it should be in a state that the power feeding terminal T touches the connection electrode E without change.

However, if the power feeding terminal T of the connector 700 contacts the inner wall of the second cylindrical insulating component 600, it is in a state easily that the power feeding terminal T is caught on the inner wall of the second cylindrical insulating component 600. This is because the second cylindrical insulating component 600 is formed by shaping a resin, and its inner wall is not a flat surface but an uneven face.

For this reason, the power feeding terminal T of the connector 700 cannot follow the movement of the connection electrode E, and it is in a state that the power feeding terminal T stays on the inner wall of the second cylindrical insulating component 600. As a result, a space is formed between a tip surface of the power feeding terminal T and the connection electrode E.

If a voltage is applied to the power feeding terminal T of the connector 700 in such state, electric discharge is generated between the power feeding terminal T and the connection electrode E, thus the voltage cannot be normally applied to the connection electrode E. Therefore, the structure cannot function as the electrostatic chuck.

Electrostatic chucks of an embodiment to be explained below can solve the problem described above.

(Embodiment)

Figure 4:
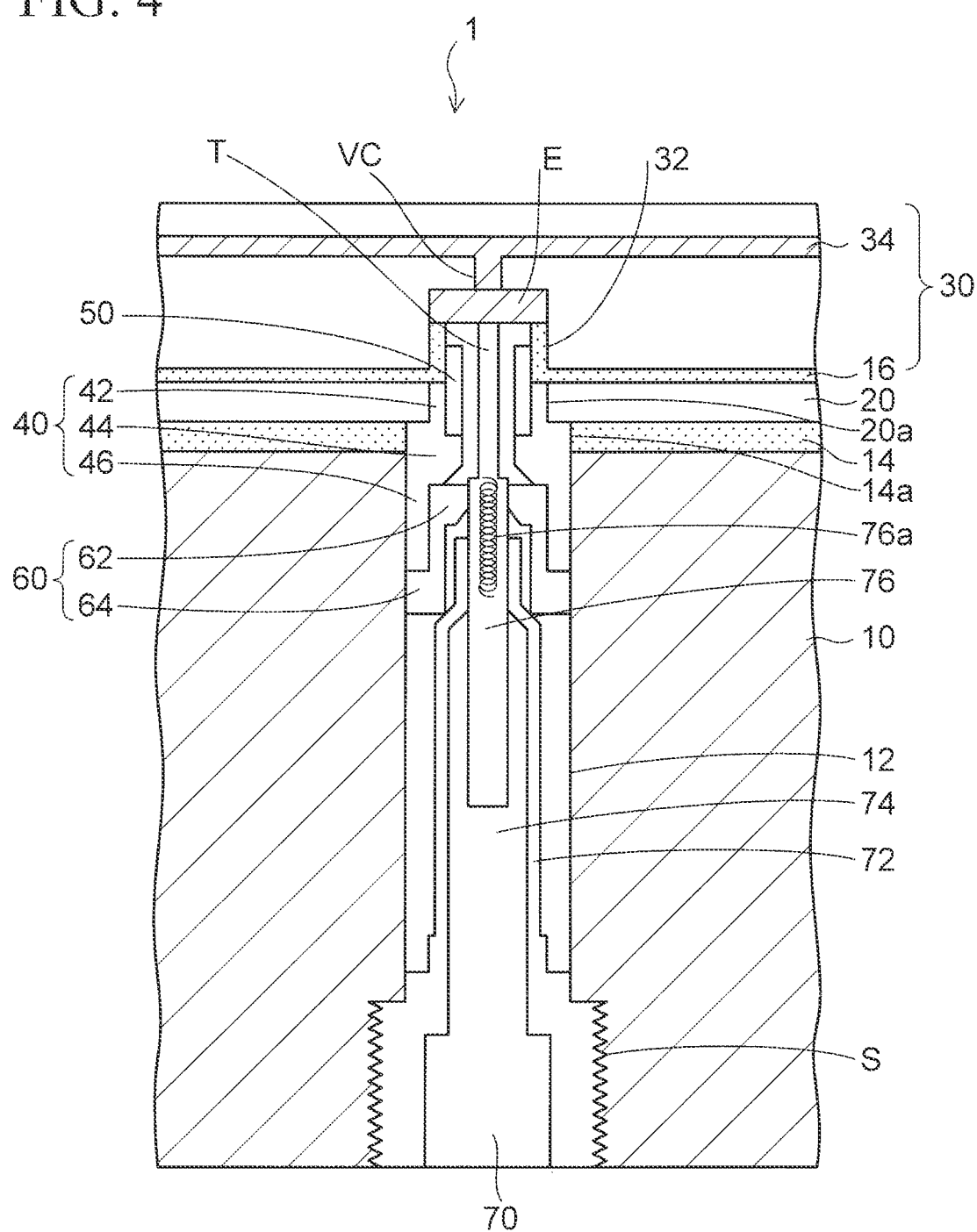
FIG. 4 is a cross-sectional view depicting an electrostatic chuck of an embodiment.

FIG. 4 is a cross-sectional view depicting an electrostatic chuck of an embodiment. As depicted in FIG. 4, an electrostatic chuck 1 of the embodiment includes a base plate 10 made of a metal such as aluminum. The base plate 10 includes a penetration hole 12 penetrating to the thickness direction.

A heater 20 is arranged to be bonded on the base plate 10 by a first adhesive layer 14. In the first adhesive layer 14, an opening portion 14a is provided at a position corresponding to the penetration hole 12 of the base plate 10. Moreover, in the heater 20, an opening portion 20a is provided on the opening portion 14a of the first adhesive layer 14, the opening portion 20a being smaller in diameter than the opening portion 14a of the first adhesive layer 14.

Further, a placing table 30 is arranged to be bonded on the heater 20 by a second adhesive layer 16. The placing table 30 is formed of a ceramic in which a main component is an aluminum oxide, for example. The placing table 30 includes a concave portion 32 at a position corresponding to the opening portion 20a of the heater 20. The second adhesive layer 16 is formed from a lower surface of the placing table 30 to a side surface of the concave portion 32.

A silicone resin-based adhesive agent is used as one preferred example of the first adhesive layer 14 and the second adhesive layer 16.

Further, the placing table 30 includes a connection electrode E on a bottom surface of the concave portion 32, and the connection electrode E is connected to an electrostatic electrode 34 formed in an inner part of the placing table 30 through a via conductor VC. In this way, the placing table 30 includes the connection electrode E at a position corresponding to the penetration hole 12 of the base plate 10.

As a method of making the placing table 30, the placing table 30 is made by forming tungsten paste which will be the connection electrode E, the via conductor VC, and the electrostatic electrode 34, on a surface and a penetration hole of a green sheet, laminating a plurality of green sheets, and burning them.

Note that, the heater 20 and the placing table 30 are arranged as different members in the example of FIG. 4, but the heater 20 may be built in the placing table 30.

A first cylindrical insulating component 40 is arranged from an upper end side of an inner wall of the penetration hole 12 of the base plate 10 to an inner wall of the opening portion 20a of the heater 20. The first cylindrical insulating component 40 includes an upper cylindrical portion 42, a first protruding portion 44 having an annular shape and protruding inward, and a lower cylindrical portion 46 in this order from the upper side. The upper cylindrical portion 42 is arranged in a state that its outer surface contacts the inner wall of the opening portion 20a of the heater 20.

Moreover, the first protruding portion 44 and the lower cylindrical portion 46 are arranged in a state that their outer surfaces contact an inner wall of the opening portion 14a of the first adhesive layer 14 and the inner wall of the penetration hole 12 of the base plate 10.

The inner diameter of the first protruding portion 44 is set to be smaller than the inner diameter of the upper cylindrical portion 42. Moreover, the inner diameter of the lower cylindrical portion 46 is set to be larger than the inner diameter of the upper cylindrical portion 42.

The first cylindrical insulating component 40 is formed of PEEK (Polyether ether ketone) resin, for example.

A second cylindrical insulating component 50 is arranged on an upper surface of the first protruding portion 44 of the first cylindrical insulating component 40. The second cylindrical insulating component 50 has the same inner diameter over the whole in the height direction. Moreover, the inner diameter of the second cylindrical insulating component 50 is set to be substantially equal to the inner diameter of the first protruding portion 44 of the first cylindrical insulating component 40.

The second cylindrical insulating component 50 is formed of a polyetherimide resin (Ultem resin), for example.

Further, a third cylindrical insulating component 60 is arranged under the first cylindrical insulating component 40. The third cylindrical insulating component 60 includes a second protruding portion 62 on an upper end side, and includes a lower cylindrical portion 64 thereunder, the second protruding portion 62 having an annular shape and protruding inward.

Then, an upper surface of the second protruding portion 62 of the third cylindrical insulating component 60 is arranged to contact a lower surface of the first protruding portion 44 of the first cylindrical insulating component 40. Also, an outer surface of the second protruding portion 62 of the third cylindrical insulating component 60 is arranged to contact an inner wall of the lower cylindrical portion 46 of the first cylindrical insulating component 40.

Further, an outer surface of the lower cylindrical portion 64 of the third cylindrical insulating component 60 is arranged to contact the inner wall of the penetration hole 12 of the base plate 10.

The inner diameter of the second protruding portion 62 of the third cylindrical insulating component 60 is set to be smaller than the inner diameter of the first protruding portion 44 of the first cylindrical insulating component 40. Also, the inner diameter of the lower cylindrical portion 64 of the third cylindrical insulating component 60 is set to be substantially equal to the inner diameter of the upper cylindrical portion 42 of the first cylindrical insulating component 40. The third cylindrical insulating component 60 is formed of the same resin material as the first cylindrical insulating component 40.

Then, a connector 70 is arranged to be inserted from the penetration hole 12 of the base plate 10 to the concave portion 32 of the placing table 30. The connector 70 includes an insulating cylindrical body 72 and a holder 74 inserted therein.

The holder 74 includes a cylindrical member 76 having an elastic body 76a such as a spring in an inner part. Then, a power feeding terminal T is connected to the elastic body 76a in the cylindrical member 76 of the holder 74. The power feeding terminal T has an elastic force to an upper and lower direction by the action of the elastic body 76a. The outer diameter of the power feeding terminal T is set to be smaller than the outer diameter of the cylindrical member 76.

A screw thread S is curved in a side surface of a lower end part of the penetration hole 12 of the base plate 10. Moreover, a screw thread S is curved in an outer surface of a lower end part of the connector 70 as well. Then, the lower end part of the connector 70 is screwed to the lower end part of the penetration hole 12 of the base plate 10.

A tip part of the cylindrical member 76 of the connector 70 is fixed to an inner wall of the second protruding portion 62 of the third cylindrical insulating component 60. In this state, the power feeding terminal T of the connector 70 is inserted to an inner part of the first protruding portion 44 of the first cylindrical insulating component 40 and an inner part of the second cylindrical insulating component 50, thus the tip surface of the power feeding terminal T touches the connection electrode E of the placing table 30.

In this way, a voltage is supplied from the power feeding terminal T of the connector 70 to the connection electrode E of the placing table 30, and the voltage is applied to the electrostatic electrode 34 through the via conductor VC.

As described above, the electrostatic chuck 1 of the embodiment is constituted. As compared with the electrostatic chuck explained in the preliminary matter, the electrostatic chuck 1 of the embodiment is additionally provided with the third cylindrical insulating component 60 under the first cylindrical insulating component 40.

By this matter, the tip part of the cylindrical member 76 of the connector 70 is fixed by the second protruding portion 62 of the third cylindrical insulating component 60. At this time, since the outer diameter of the power feeding terminal T coupled to a tip of the cylindrical member 76 is smaller than the inner diameter of the second cylindrical insulating component 50, sufficient space exists between the power feeding terminal T and an inner wall of the second cylindrical insulating component 50.

In this way, when the power feeding terminal T of the connector 70 is inserted into the inner parts of the first cylindrical insulating component 40 and the second cylindrical insulating component 50, the tip part of the cylindrical member 76 of the connector 70 is fixed to be fitted to the second protruding portion 62 of the third cylindrical insulating component 60.

For this reason, the power feeding terminal T coupled to the tip of the cylindrical member 76 of the connector 70 is inserted toward a vertical direction of an upper side without shifting to an oblique direction. Accordingly, there is no fear that the power feeding terminal T of the connector 70 contacts the inner wall of the second cylindrical insulating component 50.

Figure 5:
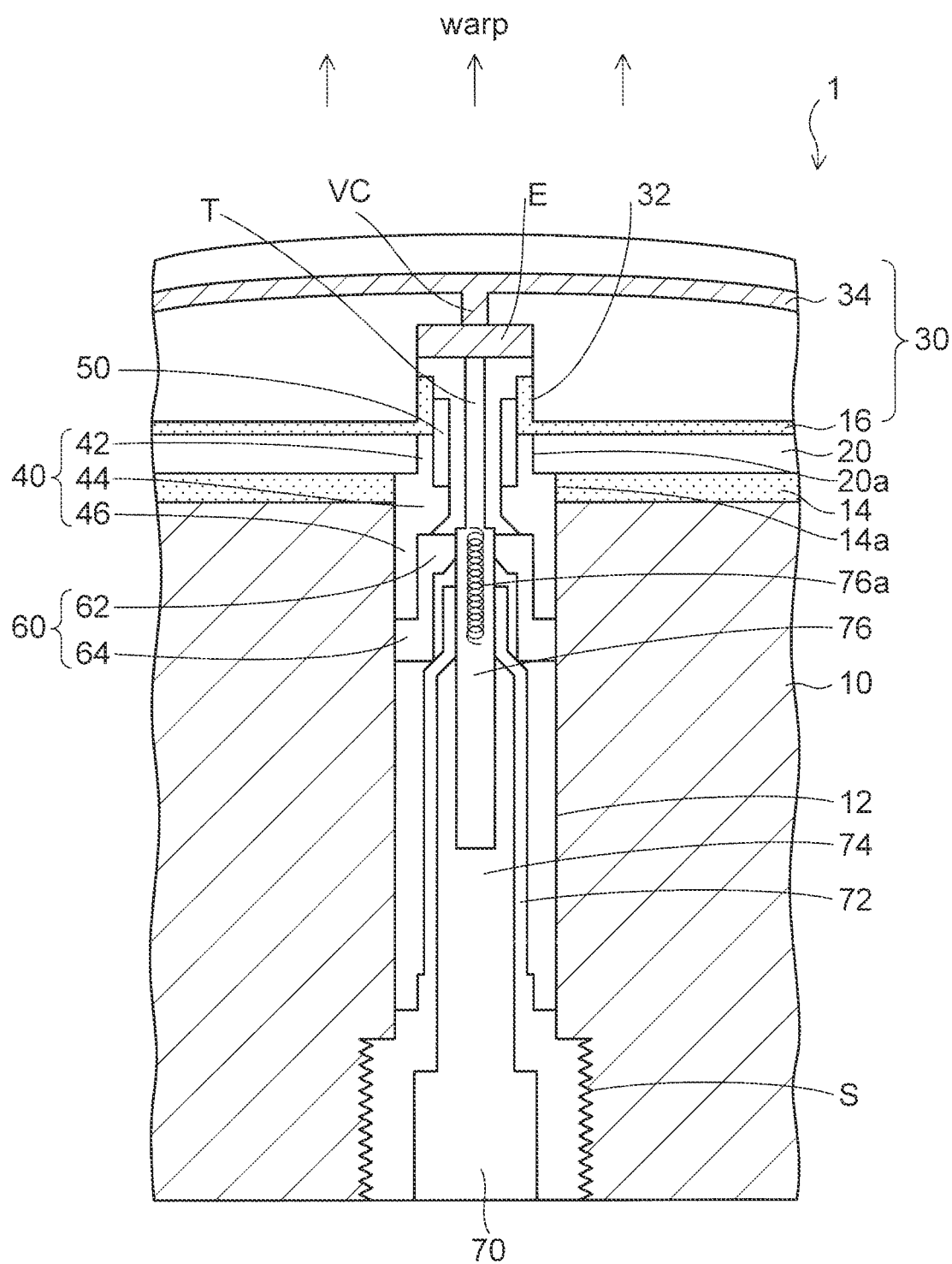
FIG. 5 is a cross-sectional view depicting a state that the electrostatic chuck of the embodiment is used in a state that it is heated.

FIG. 5 depicts a state that the heater 20 in the electrostatic chuck of this embodiment in FIG. 4 is turned on to heat the placing table 30 at a temperature of about 120° C. At this time, since the placing table 30 which is made of ceramic warps into a convex shape by the heating, the connection electrode E of the placing table 30 moves upward as well.

In this embodiment, as mentioned above, the power feeding terminal T of the connector 70 is in a free state without contacting the inner wall of the second cylindrical insulating component 50. For this reason, even if the connection electrode E moves upward by the warp of the placing table 30, since the power feeding terminal T of the connector 70 is coupled to the elastic body 76a, it is in a state that the power feeding terminal T follows the movement of the connection electrode E and touches the connection electrode E without change by the elastic force of the elastic body 76a.

By this matter, when the electrostatic chuck 1 is used in a state of being heated, it is prevented that the space is formed between the power feeding terminal T of the connector 70 and the connection electrode E of the placing table 30. Accordingly, it is possible to stably apply voltage from the power feeding terminal T to the electrostatic electrode 34 in the inner part through the connection electrode E of the placing table 30.

When a positive (+) voltage is applied to the electrostatic electrode 34 of the placing table 30, the electrostatic electrode 34 is charged with positive (+) charges, and negative (−) charges are induced on an attracted body such as a silicon wafer. By this matter, the attracted body is attracted to the placing table 30 by the Coulomb force.

Figure 6:
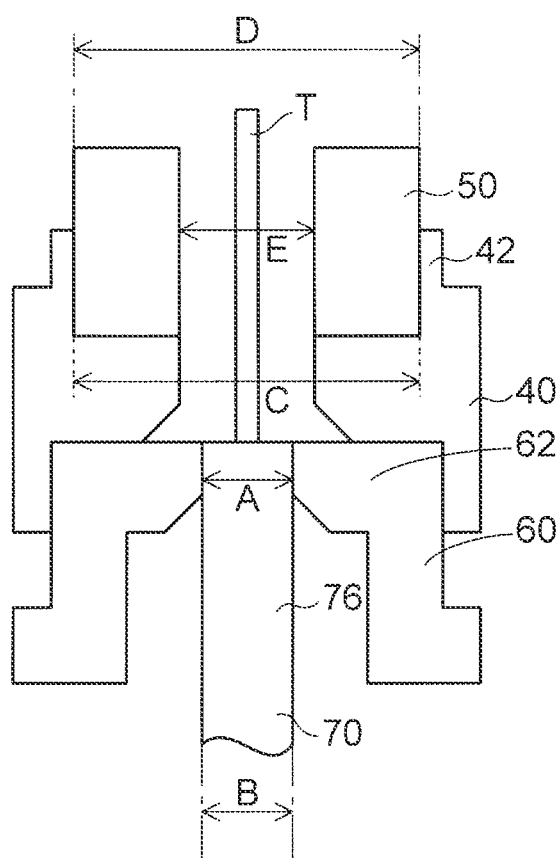
FIG. 6 is a partial cross-sectional view for explaining one example of dimension of each component of the electrostatic chuck of the embodiment.

One preferred example of dimensions of the connector 70 and each portion of the first to third cylindrical insulating components 40, 50, 60 is enumerated below with reference to FIG. 6.

The inner diameter A of the second protruding portion 62 of the third cylindrical insulating component 60: 1.85 mm±0.02 mm The outer diameter B of the cylindrical member 76 of the connector 70: 1.8 mm±0.02 mm The outer diameter of the power feeding terminal T of the connector 70: 0.759 mm The inner diameter C of the upper cylindrical portion 42 of the first cylindrical insulating component 40: 1.965 mm±0.05 mm The outer diameter D of the second cylindrical insulating component 50: 1.9 mm The inner diameter E of the second cylindrical insulating component 50: 0.92 mm By setting the dimensions of the connector 70 and the each portion of the first to third cylindrical insulating components 40, 50, 60 as described above, it is possible to make a structure in which the power feeding terminal T of the connector 70 does not contact the inner wall of the second cylindrical insulating component 50, even if the manufacturing tolerance of each member is considered.

Figure 7:
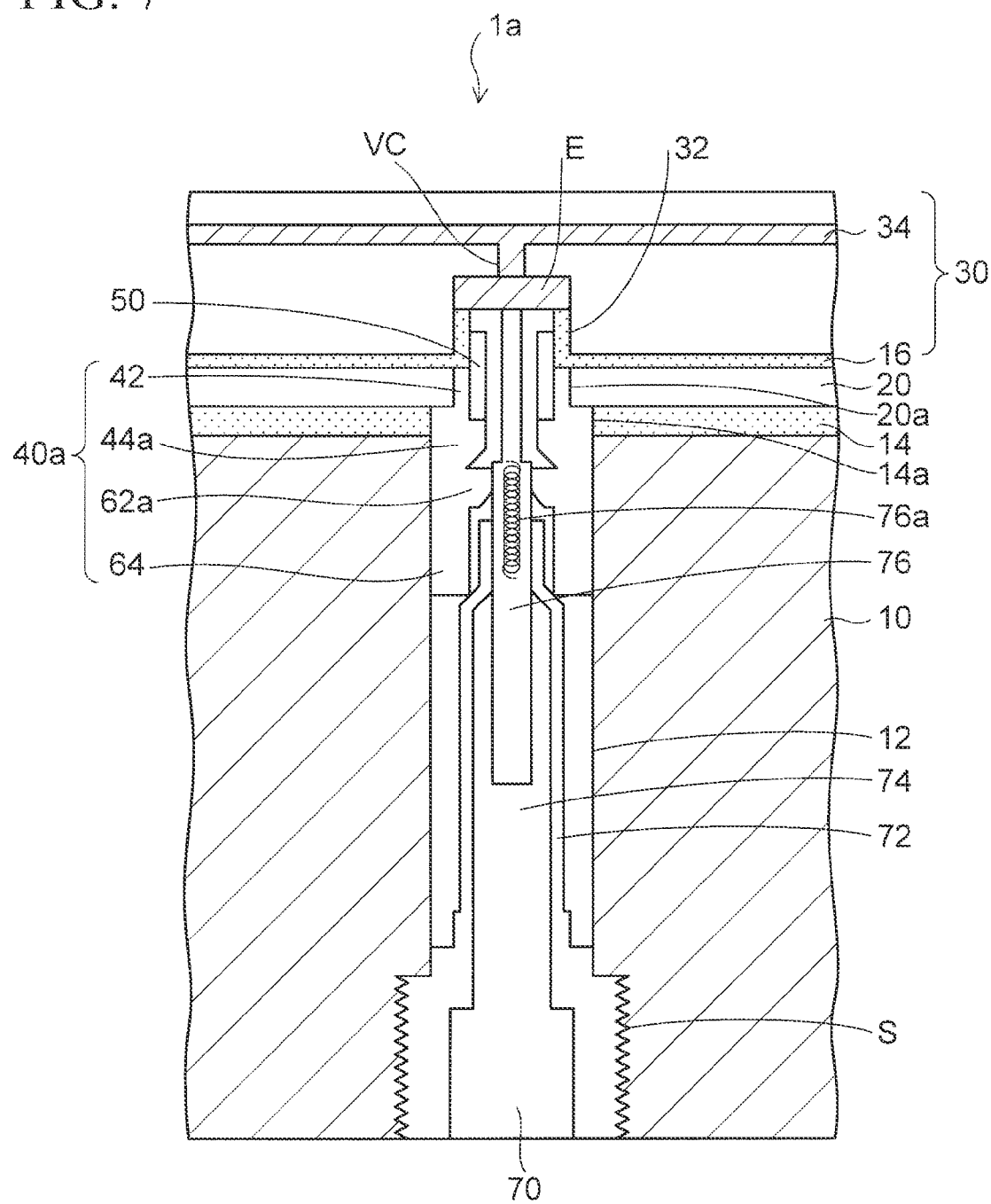
FIG. 7 is a cross-sectional view depicting an electrostatic chuck of a modification of the embodiment.

FIG. 7 depicts an electrostatic chuck 1a of a modification of the embodiment. Like the electrostatic chuck 1a of the modification in FIG. 7, in the electrostatic chuck 1 in FIG. 4, the first cylindrical insulating component 40 and the third cylindrical insulating component 60 are formed integrally by resin shaping, thus an integrated first cylindrical insulating component 40a may be constituted.

The integrated first cylindrical insulating component 40a includes a first protruding portion 44a and a second protruding portion 62a arranged thereunder in a center part of the thickness direction. Then, similarly to FIG. 4, the inner diameter of the second protruding portion 62a is set to be smaller than the inner diameter of the first protruding portion 44a.

The electrostatic chuck 1a of the modification in FIG. 7 brings about an advantageous effect similar to the electrostatic chuck 1 in FIG. 4.

Note that, in the above mode, the electrostatic chucks 1, 1a including the heater 20 are explained as preferred examples, but, an electrostatic chuck including no heater may be employed. In this mode, similarly, the first cylindrical insulating component 40 is arranged on an upper side in the inside of the penetration hole 12 of the base plate 10.

Moreover, various cylindrical shapes can be employed as the shapes of the first cylindrical insulating component 40 and the third cylindrical insulating component 60. It suffices that the minimum inner diameter of the third cylindrical insulating component 60 is set to be smaller than the minimum inner diameter of the first cylindrical insulating component 40.

Even if the case that the electrostatic chuck includes no heater, since the temperature of the electrostatic chuck rises in various plasma processes, the electrostatic chuck brings about a similar advantageous effect.

Next, a semiconductor-liquid crystal manufacturing apparatus including the electrostatic chuck 1, 1a of the embodiment described above will be explained. The electrostatic chuck 1 of this embodiment can be applied to various types of semiconductor-liquid crystal manufacturing apparatuses to be used for manufacturing processes of semiconductor devices and liquid crystal displays.

Figure 8:
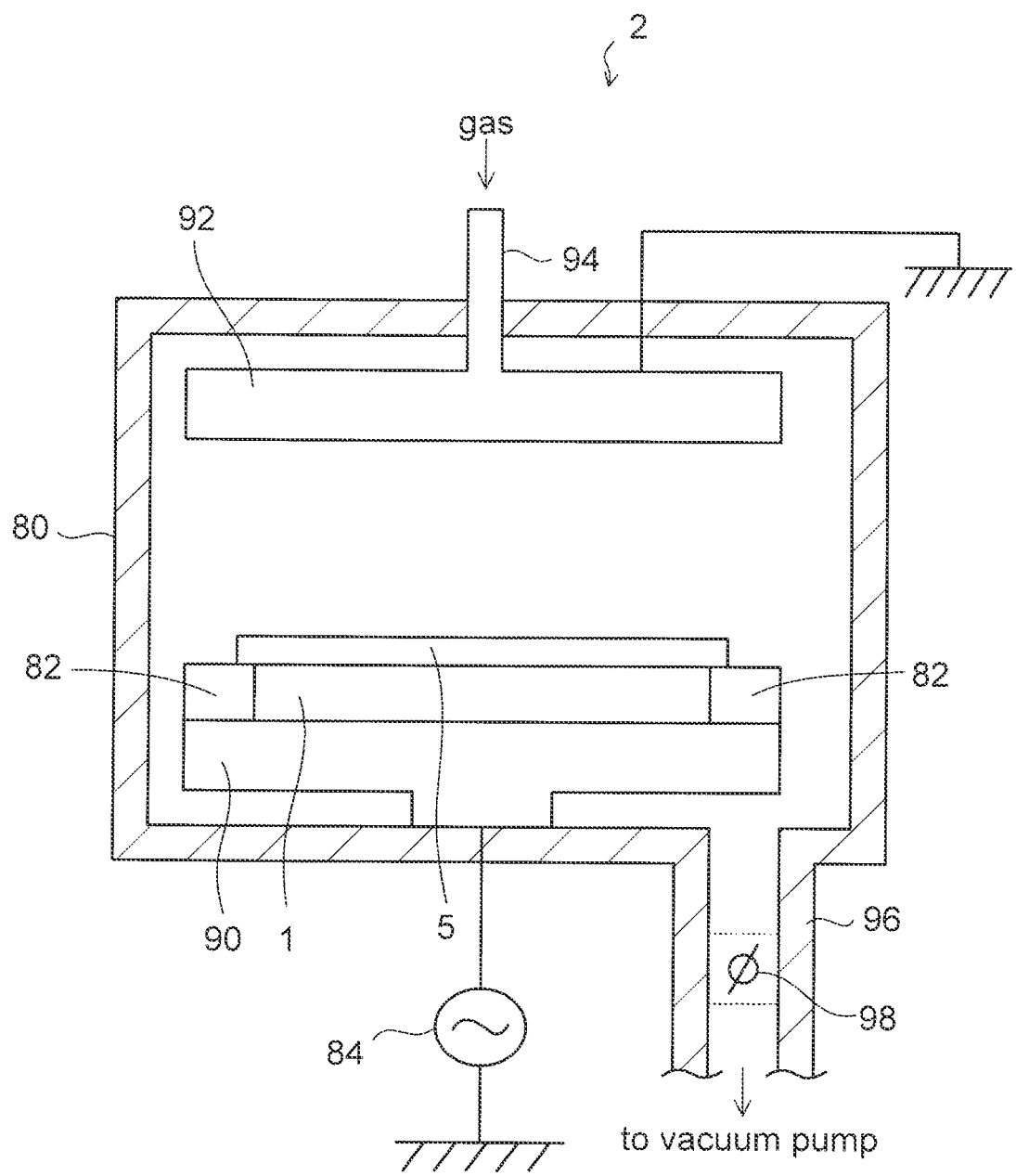
FIG. 8 is a cross-sectional view depicting one example of a semiconductor-liquid crystal manufacturing apparatus including the electrostatic chuck of the embodiment.

The following explanation will be given by enumerating a dry etching apparatus including the electrostatic chuck 1 of the embodiment as an example. FIG. is a cross-sectional view depicting the dry etching apparatus of the embodiment. As depicted in FIG. 8, a parallel-plate-type RIE apparatus is illustrated as a dry etching apparatus 2.

The dry etching apparatus 2 includes a chamber 80, and a lower electrode 90 is arranged on a lower side in the chamber 80. The electrostatic chuck 1 of the embodiment described above is attached to a surface side of the lower electrode 90, and a semiconductor wafer 5 is placed on the electrostatic chuck 1. A quartz ring 82 for protection is arranged in the periphery of the electrostatic chuck 1.

A high-frequency power source 84 for applying RF power is connected to the lower electrode 90 and the electrostatic chuck 1. An RF matcher (not depicted) for matching of the output of the RF power is connected to the high-frequency power source 84.

An upper electrode 92 which is an opposite electrode of the lower electrode 90 is arranged on an upper side in the chamber 80, and the upper electrode 92 is grounded. A gas introduction pipe 94 is coupled to the upper electrode 92, and a predetermined etching gas is introduced into the chamber 80.

An exhaust pipe 96 is connected to a lower part of the chamber 80, and a vacuum pump is attached to a distal end of the exhaust pipe 96. By this matter, reaction products or the like generated by the etching are exhausted to an exhaust gas treatment apparatus in the outside through the exhaust pipe 96.

An APC valve (Automatic pressure control valve) 98 is provided in the exhaust pipe 96 near the chamber 80, and the opening degree of the APC valve 98 is automatically adjusted such that the inside of the chamber 80 becomes a set pressure.

In the dry etching apparatus 2 of this embodiment, the electrostatic chuck 1 is heated to about 120° C. by the heater 20 (FIG. 4), and the semiconductor wafer 5 is conveyed and placed thereon.

Then, by applying a predetermined voltage to the electrostatic electrode 34 (FIG. 4) of the electrostatic chuck 1, the semiconductor wafer 5 is attracted on the electrostatic chuck 1. By this matter, it is in a state that the semiconductor wafer 5 is heated at a temperature of about 120° C.

Thereafter, a halogen gas such as a chlorine-including gas or a fluorine-including gas is introduced into the chamber 80 through the gas introduction pipe 94, and the inside of the chamber 80 is set to a predetermined pressure by the function of the APC valve 98. Then, the RF power is applied to the lower electrode 90 and the electrostatic chuck 1 from the high-frequency power source 84, thereby, plasma is generated inside the chamber 80.

By applying the RF power to the electrostatic chuck 1, a negative self-bias is formed in the electrostatic chuck side, as the result, positive ions in the plasma are accelerated toward the electrostatic chuck 1 side. Based on this, an etching target layer formed on the semiconductor wafer 5 is anisotropically etched in a high-temperature atmosphere at 120° C. or more, and is made to a pattern.

There is a copper (Cu) layer or the like as the etching target layer in which the high-temperature etching is applied. Since copper chloride is low in volatility, by heating to a high temperature, the copper chloride volatilizes more easily. Thus, the etching can progress easily.

As mentioned above, in the electrostatic chuck 1 of this embodiment, even if the placing table 30 made of ceramic is heated to a temperature of about 120° C. and warps in a convex shape, a state can be ensured in which the power feeding terminal T follows the connection electrode E of the placing table 30 and touches the connection electrode E.

By this matter, even in a case that the electrostatic chuck 1 is used in a state of being heated, voltage can be applied stably to the electrostatic electrode 34 of the placing table 30. Therefore, the semiconductor wafer 5 can be attracted reliably.

In FIG. 8, the electrostatic chuck 1 of this embodiment is applied to a dry etching apparatus. However, the electrostatic chuck 1 may be applied to various other types of semiconductor-liquid crystal manufacturing apparatuses to be used for manufacturing process of semiconductor devices and liquid crystal displays such as plasma CVD apparatuses and sputtering apparatuses.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and interiority of the invention. Although the embodiments of the present invention have been described in detail, it should be understood that the various changes, substitutions, and alterations could be made hereto without departing from the spirit and scope of the invention.

What is claimed is:

1. An electrostatic chuck, comprising:
    a base plate including a penetration hole;
    a placing table arranged on the base plate, the placing table including an electrode at a position corresponding to the penetration hole;
    a first cylindrical insulating component arranged on an upper side inside the penetration hole of the base plate;
    a second cylindrical insulating component arranged on the first cylindrical insulating component;
    a third cylindrical insulating component arranged under the first cylindrical insulating component, the third cylindrical insulating component having an inner diameter smaller than an inner diameter of the first cylindrical insulating component, the third cylindrical insulating component having a protruding portion protruding from an inner wall inside at an upper end side;
    a connector arranged in the penetration hole;
    an insulating cylindrical body included in the connector;
    a cylindrical member included in the connector, the cylindrical member arranged in the insulating cylindrical body, and protruding from an upper end of the insulating cylindrical body;
    an elastic body arranged in an inner part of the cylindrical member; and
    a power feeding terminal included in the connector, the power feeding terminal connected to the elastic body, the power feeding terminal protruding from an upper end of the cylindrical member,
    wherein the power feeding terminal touches the electrode of the placing table in a state that the cylindrical member of a part protruding from the insulating cylindrical body of the connector is fixed by the protruding portion of the third cylindrical insulating component.

2. The electrostatic chuck according to claim 1, wherein the electrostatic chuck includes a heater.

3. The electrostatic chuck according to claim 1, wherein the electrode of the placing table is formed on a bottom surface of a concave portion in the placing table.

4. The electrostatic chuck according to claim 1, wherein the first cylindrical insulating component and the third cylindrical insulating component are formed integrally.

5. The electrostatic chuck according to claim 1, wherein an outer diameter of the power feeding terminal is set to be smaller than an outer diameter of the cylindrical member, and a space exists between the power feeding terminal and the second cylindrical insulating component.

6. A semiconductor-liquid crystal manufacturing apparatus, comprising:
    a chamber; and
    an electrostatic chuck attached in the chamber, wherein the electrostatic chuck includes
        a base plate including a penetration hole;
        a placing table arranged on the base plate, the placing table including an electrode at a position corresponding to the penetration hole;
        a first cylindrical insulating component arranged on an upper side inside the penetration hole of the base plate;
        a second cylindrical insulating component arranged on the first cylindrical insulating component;
        a third cylindrical insulating component arranged under the first cylindrical insulating component, the third cylindrical insulating component having an inner diameter smaller than an inner diameter of the first cylindrical insulating component, the third cylindrical insulating component having a protruding portion protruding from an inner wall inside at an upper end side;
        a connector arranged in the penetration hole;
        an insulating cylindrical body included in the connector;
        a cylindrical member included in the connector, the cylindrical member arranged in the insulating cylindrical body, and protruding from an upper end of the insulating cylindrical body;
        an elastic body arranged in an inner part of the cylindrical member; and
        a power feeding terminal included in the connector, the power feeding terminal connected to the elastic body, the power feeding terminal protruding from an upper end of the cylindrical member, wherein the power feeding terminal touches the electrode of the placing table in a state that the cylindrical member of a part protruding from the insulating cylindrical body of the connector is fixed by the protruding portion of the third cylindrical insulating component.

* * * * *